(12) United States Patent
Mahdi Hayder et al.

(10) Patent No.: US 11,483,944 B1
(45) Date of Patent: Oct. 25, 2022

(54) CARTRIDGE FOR INTERCONNECTIVITY AMONG RACK-MOUNTED AND LINEARLY ALIGNED NETWORKING COMPONENTS

(71) Applicant: Amazon Technologies, Inc., Seattle, WA (US)

(72) Inventors: Alaa Adel Mahdi Hayder, Sammamish, WA (US); Paul Yu, Saratoga, CA (US)

(73) Assignee: Amazon Technologies, Inc., Seattle, WA (US)

( * ) Notice: Subject to any disclaimer, the term of this patent is extended or adjusted under 35 U.S.C. 154(b) by 11 days.

(21) Appl. No.: 17/101,587

(22) Filed: Nov. 23, 2020

(51) Int. Cl.
*H05K 7/14* (2006.01)
*H05K 5/02* (2006.01)

(52) U.S. Cl.
CPC ......... *H05K 7/1489* (2013.01); *H05K 5/0221* (2013.01)

(58) Field of Classification Search
None
See application file for complete search history.

(56) References Cited

U.S. PATENT DOCUMENTS

| | | | |
|---|---|---|---|
| 4,984,108 A * | 1/1991 | Grant | G11B 15/6835 414/280 |
| 6,515,822 B1 * | 2/2003 | White | G11B 17/225 360/92.1 |
| 7,334,978 B2 * | 2/2008 | Coffin | G11B 17/225 360/98.05 |
| 9,185,833 B2 * | 11/2015 | Alshinnawi | H05K 9/0015 |
| 9,832,904 B1 * | 11/2017 | Giroux | H04Q 1/09 |
| 10,163,460 B1 * | 12/2018 | Dolbear | G11B 15/6835 |
| 10,524,380 B2 * | 12/2019 | Brink | H05K 7/1491 |
| 2006/0250766 A1 * | 11/2006 | Blaalid | G06F 1/187 361/679.33 |
| 2010/0007981 A1 * | 1/2010 | Kerns | G11B 33/128 360/69 |
| 2010/0216335 A1 * | 8/2010 | Cobb | H01R 13/6658 439/540.1 |
| 2019/0350103 A1 * | 11/2019 | Sassano | H05K 7/1489 |
| 2021/0251097 A1 * | 8/2021 | Gao | H05K 7/20736 |

* cited by examiner

*Primary Examiner* — Xanthia C Cunningham
(74) *Attorney, Agent, or Firm* — Kilpatrick Townsend & Stockton LLP

(57) ABSTRACT

A rack within a datacenter or other environment can include a plurality of appliances arranged in the rack such that ports of the appliances are aligned vertically or in another direction. A cartridge can include an elongate rigid body along which connectors are arranged. The connectors may be engageable with the aligned ports of the appliances in response to translation of the cartridge toward the rack. The cartridge can include cabling within the elongate rigid body, and the cabling can provide paths among subsets of the connectors, for example, such that subsets of the appliances are accordingly connected for transmission of data or other signals.

19 Claims, 5 Drawing Sheets

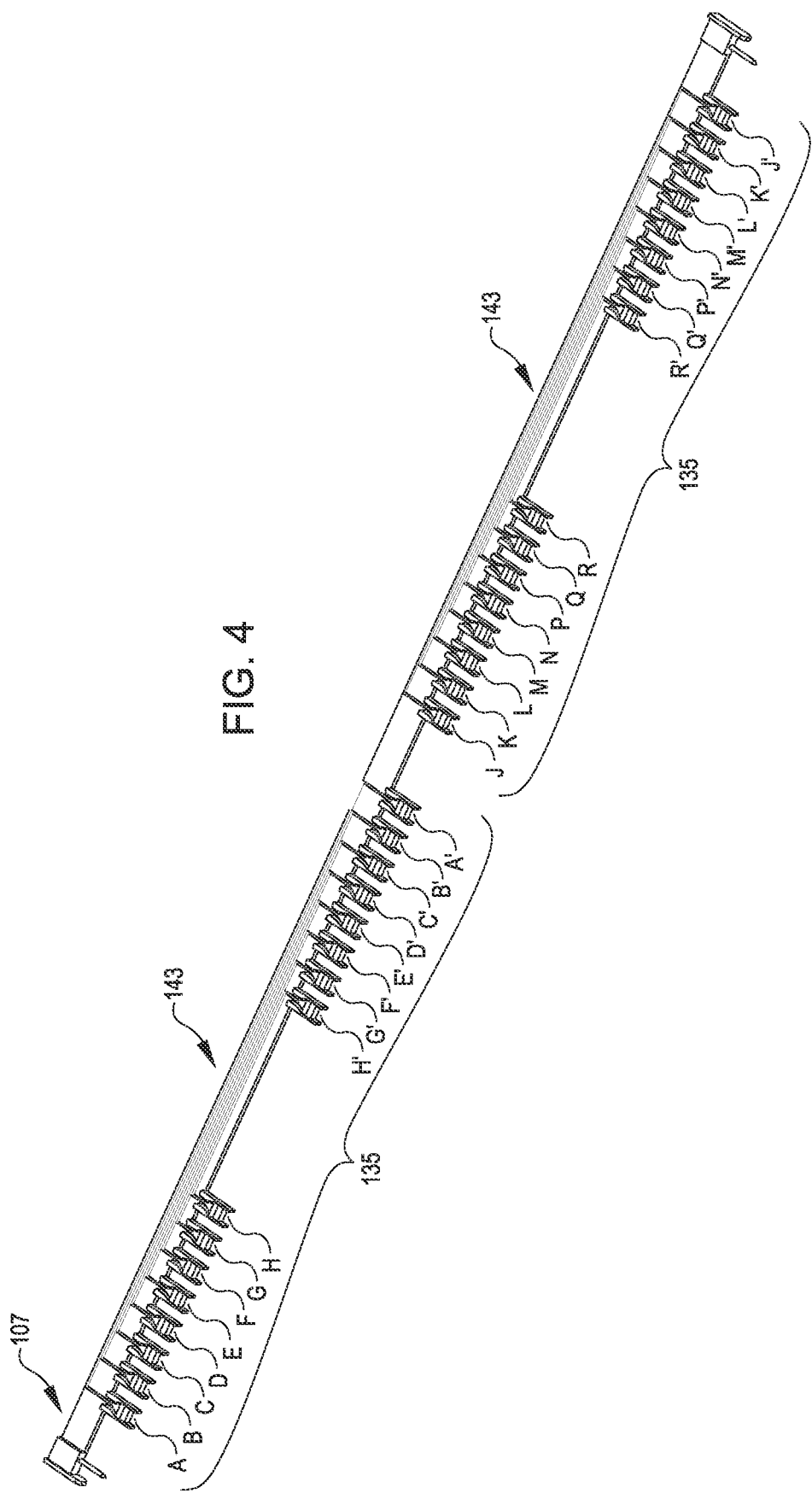

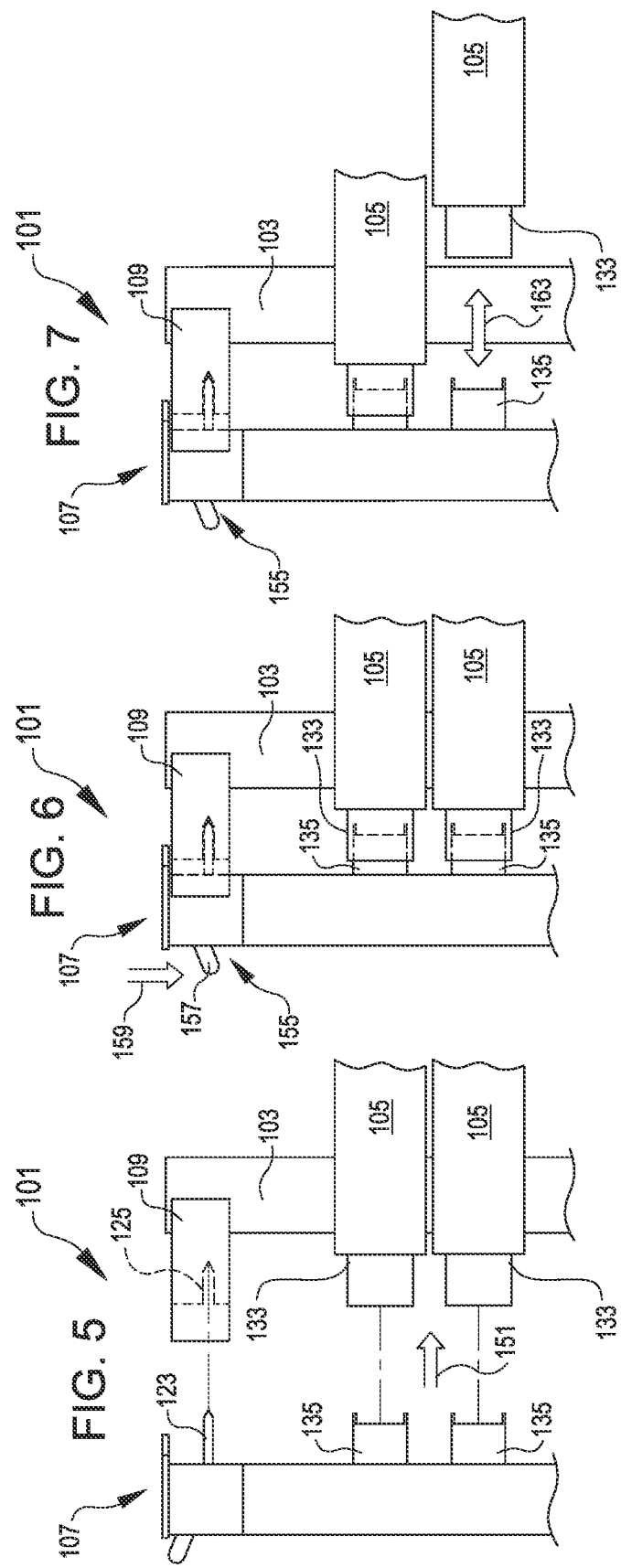

CARTRIDGE FOR INTERCONNECTIVITY AMONG RACK-MOUNTED AND LINEARLY ALIGNED NETWORKING COMPONENTS

BACKGROUND

Datacenters house collections of servers and networking hardware, including switches and routers. Many different cabled connections between components may be used to, for example, permit data or power transfer between the components. The manner in which cables are managed can become a significant factor in datacenter operations, especially as any excess cabling can have corresponding costs to supply, install, and/or maintain. In addition, cables and/or accompanying structures to guide, retain, route, or otherwise manage cables can occupy significant amounts of space and thus reduce total space that can be available for components that contribute computing power within a datacenter.

BRIEF DESCRIPTION OF THE DRAWINGS

Various embodiments in accordance with the present disclosure will be described with reference to the drawings, in which:

FIG. 4 depicts a partial cutaway view of an entire cartridge for use in the system of FIG. 1 according to various embodiments; and FIGS. 5 through 7 depict side views of a portion of the system of FIG. 1 in differing states of installation and utilization according to various embodiments.

DETAILED DESCRIPTION

Figure 1:
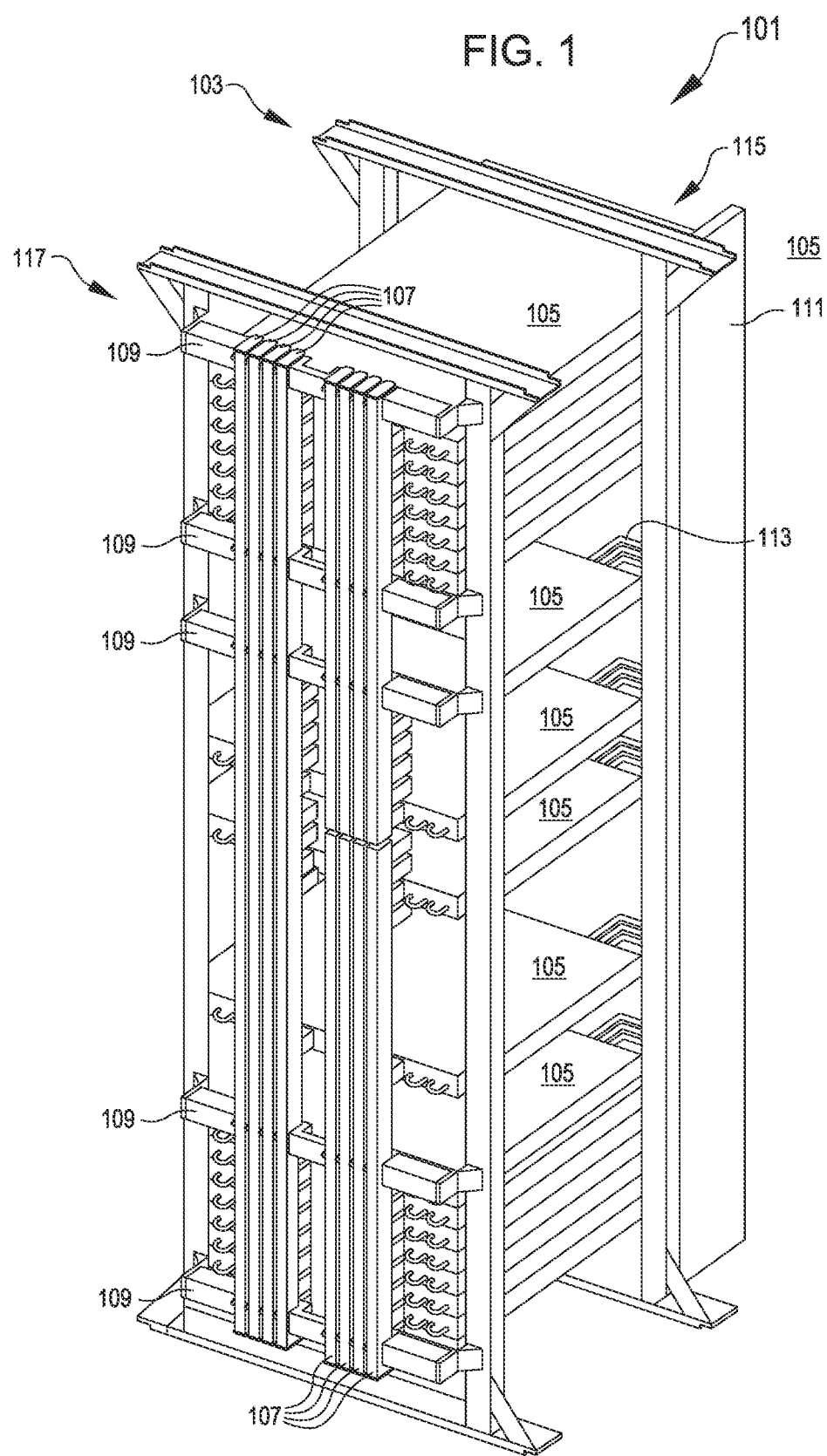
FIG. 1 depicts a rear perspective view of a system including cartridges for interconnecting appliances received within a rack according to various embodiments.

Embodiments herein are directed to cabling arrangements and associated components for computing equipment, such as may be used in computer networks for data centers or other locations. The cabling arrangements can include cartridges that can be installed relative to racks bearing appliances such as computer servers, networking hardware components, or other computing devices.

The cartridges can facilitate rapid installation and connection of the appliances to one another within the rack. For example, the rack can arrange the appliances above one another so that ports in the rear of the appliances are aligned vertically. The cartridges can include connectors present on rectangular projections that are spaced apart to match spacing between the ports. Thus, installing the cartridge (such as by translating the cartridge toward the rear of the rack) can cause the projections to simultaneously engage multiple vertically aligned ports.

Cabling within the cartridge can provide interconnection between different subsets of the ports to enable transmission of data signals back and forth, for example. As an illustrative example, cabling from a first projection may run down to a fifth projection so that the ports of fifth and first appliances in the rack can transmit data to one another, while ports on second and sixth appliances can be interconnected by cabling through second and sixth projections of the cartridge, and so forth. Aligning cabling vertically within the cartridges may allow less cabling to be used and/or less space to be occupied in comparison to arrangements in which cabling is routed first laterally and then up or down along a support column of the rack before being laterally routed back across into engagement or connection with a port of a different appliance.

In use, the cartridges can provide rapid and simple installation in a manner that can readily connect multiple sets of ports to one another at once. Installation of the cartridges may be facilitated by guides, for example, at either end of the cartridge. The guides can engage mating structures to facilitate blind mating of the projections of the cartridge with ports of the appliances. For example, pins and correspondingly sized openings, ramped surfaces, or other guide structures may be utilized. Guides and/or mating structure may be included in cross bars mounted to columns, beams, or other structural components of the rack.

Once seated, the cartridge can be secured in place, such as by depressing a lever (or other actuator or manipulandum of a latch) in order to secure the cartridge relative to the rack. Once secured, the cartridge may remain in place relative to the rack even when appliances are pulled out of the rack for maintenance, replacement, or other access of the appliances (and thus out of engagement with the cartridge) or when further appliances are installed in to open slots or berths within the rack (such as when filling empty slots with new or re-inserted appliances).

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Turning now to the figures, FIG. 1 depicts an assembly or system 101. The system 101 can include a rack 103, appliances 105, and cartridges 107. Generally, the appliances 105 can be received or situated within the rack 103, and the cartridges 107 can be installed in coupling engagement with the appliances 105 to provide interconnection among the appliances 105, such as for transfer of data, power, or other signals. During installation, the cartridges 107 may be mounted to the rack 103. The mounting may be direct or via intervening structure, such as cross bars 109.

The rack 103 can include suitable structure for supporting appliances 105 and associated components. For example, metal or other suitably load-bearing material may be implemented in columns, beams, or other suitable structures, which may include the cross bars 109. Structure of the rack 103 can be coupled by bolts, screws, or any other suitable fasteners or fastening technique (including, but not limited to, welding, adhesives, or mechanical fasteners). The appliances 105 may be slidably received within the rack 103, such as along rails or other tracks (which are omitted for the sake of clarity in FIG. 1).

In FIG. 1, the rack 103 is also shown with the cross bars 109 installed for facilitating engagement with the cartridges 107. The cross bars 109 may correspond to a portion of the rack 103 and/or may correspond to structure coupled with the rack 103. The cross bars 109 may be positioned at any suitable vertical position along the rack 103. For example, for the leftward bank of cartridges 107 in FIG. 1, opposite ends of the cartridges 107 are shown received or releasably secured by an upper cross bar 109 that is rearwardly mounted to an upper portion of the rack 103 above the appliances 105 and by a lower cross bar 109 that is rearwardly mounted to a lower portion of the rack 103 below the appliances 105. However, cross bars 109 may be additionally or alternatively situated to receive any part between the ends of the cartridges 107 and/or arranged at one or more intermediate positions in-between some appliances 105 to provide suitable securing or anchoring of the cartridge 107. As an illustrative example, for the rightward bank of cartridges 107 in FIG. 1, one end is received in a cross-bar 109 while another end is cantilevered from a mounting position (although both ends may be cantilevered beyond mounting positions in some embodiments). Although five cross bars 109 are shown by way of example in FIG. 1, any number of one or more cross bars 109 may be utilized. Additionally, although some cartridges 107 (e.g., in the leftward bank in FIG. 1) are depicted as extending substantially a full height of the rack 103, the system 101 may additionally or alternatively include cartridges 107 of greater or lesser height, such as half-height cartridges 107 (e.g., depicted in the rightward bank in FIG. 1 by way of example), and/or cartridges 107 may correspond to (or exceed or be less than) some other whole or partial portion of the full height of the rack 103 or associated component.

The rack 103 may also support and/or be serviced by a power supply unit 111. The power supply unit 111 may supply power through power conduits 113, which may provide power to the appliances 105. The power supply unit 111 is shown along a front side 115 of the rack 103, and the cartridges 107 are shown installed along a rear side 117 of the rack in FIG. 1, although the respective front or rear placement of respective components may be reversed or otherwise different than that depicted in FIG. 1.

The appliances 105 can include computer servers, network hard drive components, network switches, or other network hardware components or other appliance for a data center or other environment. In some embodiments, the appliances 105 may correspond to a single type of component (e.g., all network switches) or may include combinations of different types of components (e.g., some network switches and some servers).

In an installed position (such as shown in FIG. 1), the cartridges 107 may provide interconnection among the appliances 105. In use, to reach an installed position, the cartridges 107 may be installed relative to additional structure discussed further in FIG. 2.

Figure 2:
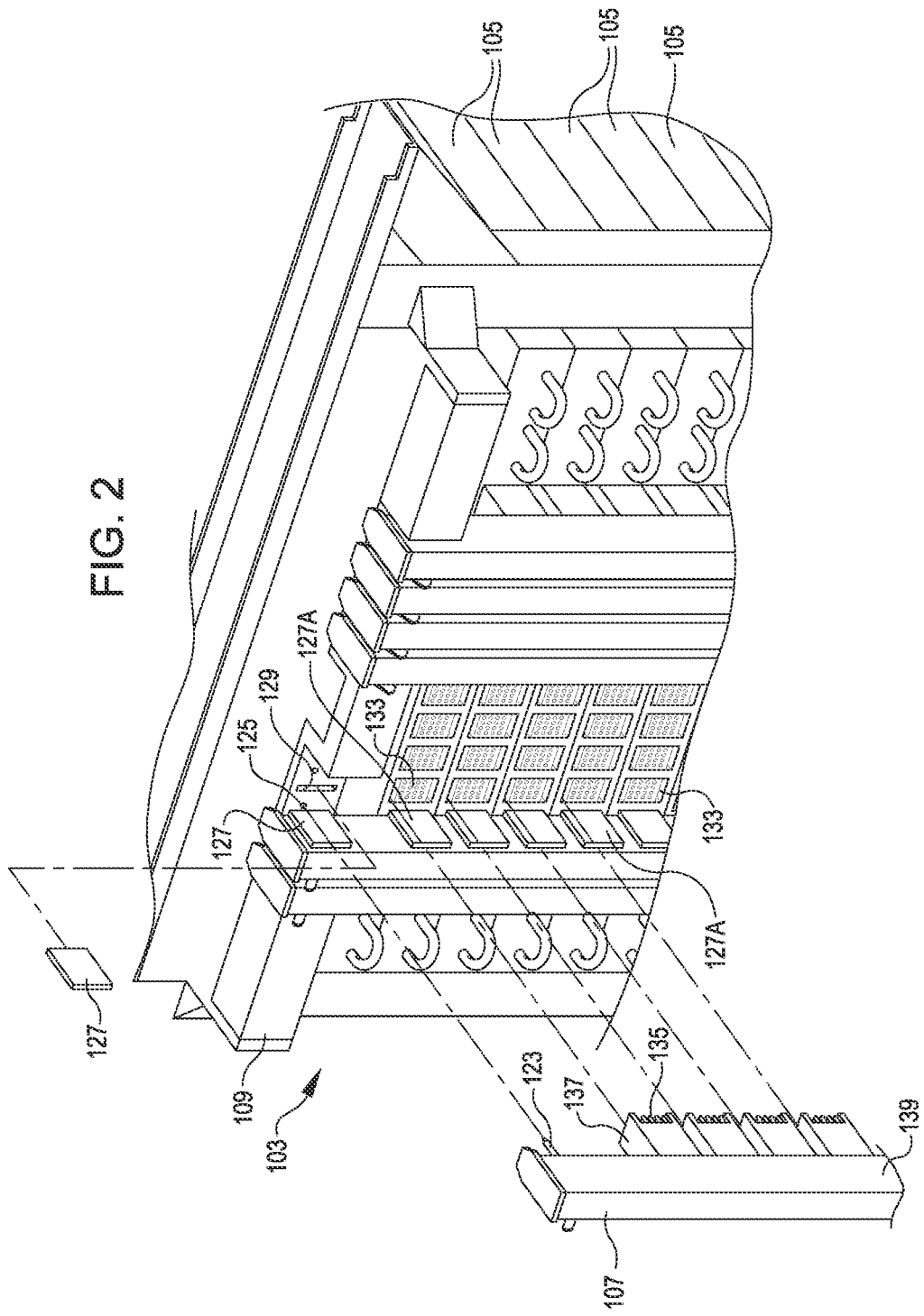
FIG. 2 depicts a partially exploded assembly view of a portion of the system of FIG. 1 according to various embodiments.

FIG. 2 illustrates a partially exploded assembly view of a portion of the system 101 of FIG. 1. A given cartridge 107 can include sub-features that can facilitate engagement with sub-features of the rack 103 and/or with sub-features of the appliances 105. For example, the cartridge 107 can include a guide 123 that can interface with a receptacle 125 (e.g., which may be included in the cross bar 109 and/or the rack 103). The guide 123 in FIG. 2 is depicted as a pin with a tapered tip, and the receptacle 125 is depicted as including a corresponding receiving opening, although the guide 123 and/or receptacle 125 can include ramped surfaces, recessed features, or any other suitable guiding structures additionally or alternatively. For example, the receptacle 125 is shown in FIG. 2 as further being defined at least in part by dividers 127. The dividers 127 are shown in FIG. 2 as panels that are releasably attachable (e.g., by insertion into an indentation 129), although permanently fixed attachment additionally or alternatively may be used. The dividers 127 may be included to provide separation between adjacent slots or berths for the cartridges 107. For example, the dividers 127 may facilitate installation of multiple cartridges 107 arranged laterally relative to one another to engage different columns or sets of vertically aligned ports 122 of the appliances 105. However, although description herein primarily references vertically aligned ports 122, components and techniques may additionally or alternatively be implemented in other orientations, such as in which ports 122 are horizontally aligned, linearly aligned, aligned in a staggered orientation, or otherwise aligned along a first or other direction. Overall, the guide 123 and the receptacle 125 can function to facilitate proper alignment of the cartridge 107 during installation.

The appliances 105 can include respective ports 133. The ports 133 can include any suitable form factor and may differ from or be alike to one another. The ports 133 may correspond to—or be compatible with—backplane structures, for example. In some examples, the ports 133 serve as at least a portion of a digital-to-analog converter (DAC). The ports 133 may correspond to any suitable form factor of pluggable module, pluggable media, pluggable transceiver, or other pluggable component. For example, the ports 133 may be sized and arranged to meet any suitable standard for pluggable optical transceivers. In one non-limiting example, one or more of the ports 133 may correspond to a small form-factor pluggable (SFP) transceiver, such as is commonly used for telecommunication and/or data communications applications. In another non-limiting example, one or more of the ports 133 comprises an enhanced small form-factor pluggable (SFP+) transceiver or a compact small form-factor pluggable (CSFP) transceiver. In an additional non-limiting example, one or more of the ports 133 comprises an RJ45 connector or a similar connector. Further non-limiting examples may include QSFP, QSFP+, QSFP28, QSFP56, QSFP56-DD, OSFP, or other standards that may be known in the art.

The ports 133 can be arranged so that the ports 133 are vertically aligned, aligned in columns or rows, or otherwise aligned between different appliances 105. The ports 133 can provide interfaces for connection and transfer of data or other electrical or optical signals or other varieties of signals. Any suitable arrangement and/or features may be utilized to facilitate appropriate engagement of the ports 133 with structure of the cartridge 107. For example, dividers 127A are depicted in FIG. 1 and may correspond to elements that may be similar or different in structure and/or function relative to dividers 127 described above with respect to the receptacle of the guide 125, or any other suitable guiding, aligning, protecting, and/or other interfacing structure may be utilized.

The cartridge 107 can include connectors 135. The connectors 135 can include suitable structure for engaging the ports 133. For example, the connectors 135 and the ports 133 can correspond to opposite mating components of a connection interface that are sized and arranged for engaging one another. The connection interface can facilitate blind-mate engagement, for example. Any suitable male and female portions of the connection interface may be included among the connectors 135 and ports 133. For example, although FIG. 2 primarily depicts connectors 135 having pins insertable into pin-holes in the ports 133, either or both of the port 133 and connector 135 may include some protruding structure that is receivable within an opening, may include an opening or other suitable complementary structure suitable for receiving a protrusion from a mating component, or may include some combination of protrusion and receiving structure. As a further illustrative example, although the arrangement depicted in FIG. 2 is shown with ports 133 that appear substantially flush with a rear face defined by the appliances 105, ports 133 may additionally or alternatively include structure that is recessed into and/or projecting out from the appliances 105. Similarly, although the connectors 135 are shown projecting from the cartridge 107, connectors 135 may additionally or alternatively include structure that is flush and/or recessed relative to the cartridge 107.

In FIG. 2, the connectors 135 are depicted as borne by and/or included in projections 137. The projection 137 may extend forward of a body 139 of the cartridge 107. For example, the body 139 may include a casing or shell formed of metal, plastic, or some other suitable material for the body 139 to be rigid, elongate, and/or upright during use. The body 139 may be hollow or tube-like, e.g., which may facilitate a construction such as that shown in FIG. 3.

Figure 3:
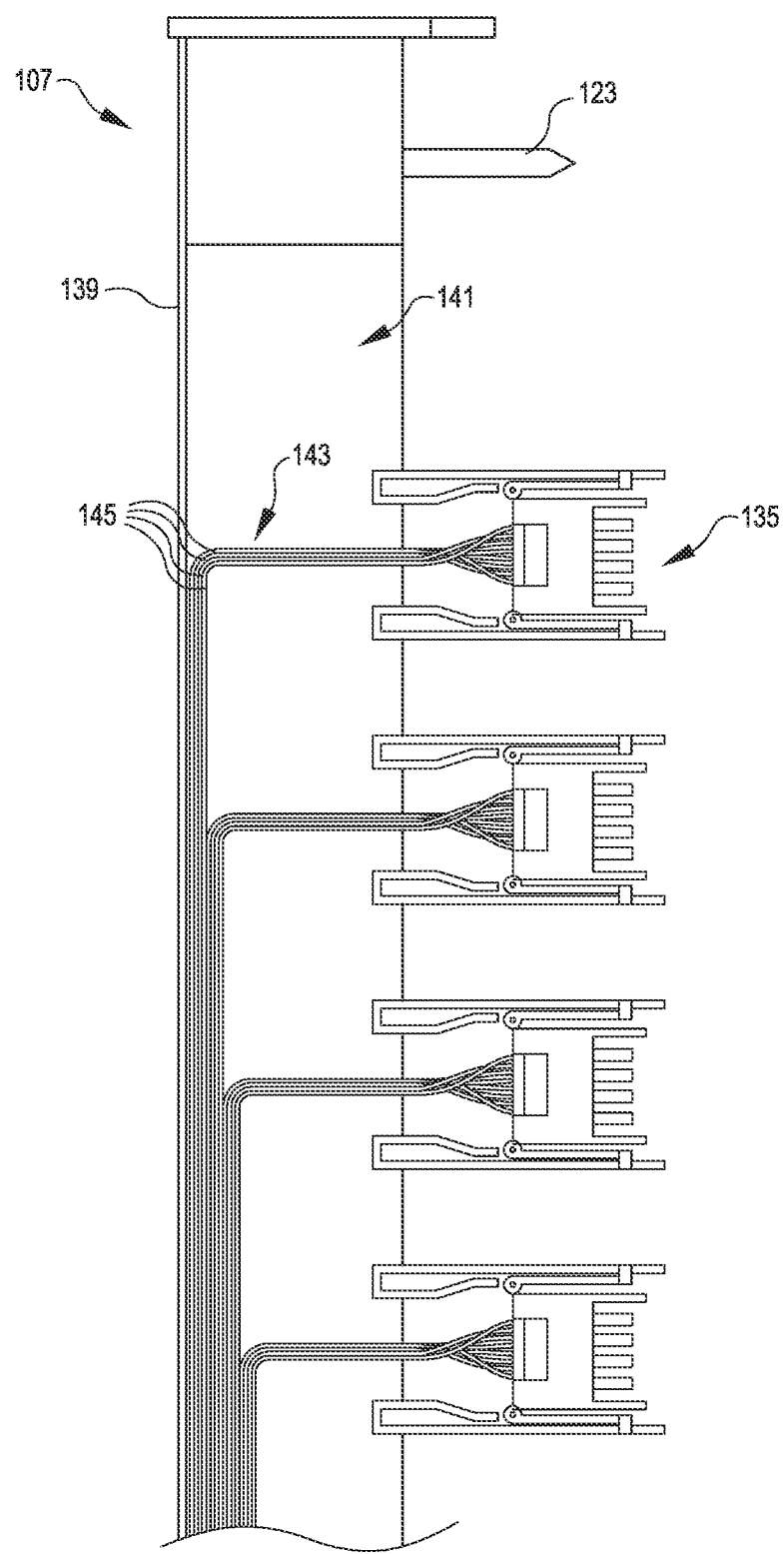
FIG. 3 depicts a side partial cut away view of a cartridge of the system of FIG. 1 according to various embodiments.

FIG. 3 illustrates a side partial cut away view of a cartridge 107. The body 139 of the cartridge 107 may define an internal volume 141. The internal volume 141 may contain cabling 143. As non-limiting examples, the cable 152 may include copper, glass, or other materials suitable for transmission of appropriate signals therethrough. The cabling 143 may correspond to any suitable type of cable including, but not limited to, electrical cable (e.g., formed with copper or other electrically conductive cores), fiber optic cables (e.g., formed with a glass or other light-transmitting core), or other types. Generally, the cabling 143 can include suitable wiring, optical fibers, and/or other conduits for transmitting electrical power, data, and/or other signals there through. Although the cabling 143 and associated components depicted and described herein may be particularly suited for optical transmissions, in some aspects, the cabling 143 may be replaced with and/or include a conduit for other connection types, in addition or as alternatives, such as connections for acoustic communication, fluid communication, and/or electrical communication.

The cabling 143 can include individual cables 145. Each respective cable 145 may be coupled at one end to a respective connector 135 and routed through the body of the cartridge 107. Multiple cables 145 may be connected with a particular connector 135 and may be bundled or otherwise appropriately arranged to facilitate connection with different lanes or channels enabled by the connector 135. Any suitable combination or routing of cables 145 may be utilized to provide interconnection among subsets of the connectors 135.

FIG. 4 illustrates a partial cutaway view of an entire cartridge 107 according to certain embodiments. FIG. 4 illustrates an illustrative example of how cabling 143 may be utilized to connect respective subsets of connectors 135. The cabling 143 may establish signal paths between respective pairs of the connectors 135 and/or associated ports 133, for example. In FIG. 4, respective connectors 135 are identified with individual letters which indicate which connectors 135 are connected to one another by cabling 143. For example, the cabling 143 may function so that the connectors 135 labeled A and A' are connected to one another, while the connectors 135 labeled B and B' are connected to one another, and so on. FIG. 4 is but one example of how the internal cabling 143 may be arranged to provide connection to subsets among the connectors 135 depicted in FIG. 4, however. For example, if a different set of interconnectivity is desired for a particular scenario, a cartridge 107 with a different arrangement of cabling 143 may be provided in which other subsets are connected differently (such as with A being connected to H', B being connected to G', and so on as an illustrative example). Such variability may allow ready interchangeability among cartridges 107 with different cabling arrangements to rapidly change arrangements of interconnection or signal paths among the appliances 105.

The cartridge 107 is not limited to the number of connectors 135 shown in FIG. 4, but may include fewer or more and/or different spacing or clustering as fits a particular scenario. Generally, any number of two or more connectors 135 can be included on a cartridge 107 to provide a suitable connection between a corresponding arrangement of appliances 105. In addition, the connectors 135 may be clustered into subgroups (e.g., A through H and H' through A' may be in one interconnected group while J through R and J' through R' may be in another, distinct interconnected group in one illustrative example). At the same time, it is to be understood that the routing of the cabling 143 within the cartridge 107 may permit connection between different subgroups of connectors 135. In addition, although FIG. 4 illustrates an arrangement of cabling 143 with a one-to-one arrangement between coupled connectors 135, the cabling 143 may additionally or alternatively include arrangements of cabling 143 in which many-to-one, one-to-many, or many-to-many arrangements are enabled by the cabling 143.

FIGS. 5 through 7 illustrate the system 101 from a side view and depict differing states of installation and utilization according to certain embodiments. In FIG. 5, elements are depicted in a position that can facilitate installation. The cartridge 107 may be positioned so that the guide 123 is aligned with the receptacle 125 (e.g., in the cross bar 109 or other portion of the rack 103). The cartridge 107 may be translated or otherwise moved toward the rack 103, e.g., as illustrated by arrow 151. As the guide 123 approaches and is received by and/or engages the receptacle 125, the taper of the guide 123 or other mating features may cause adjustments in the alignment of the cartridge 107 relative to the rack 103 so that the connectors 135 of the cartridge 107 are aligned with the ports 133 of the appliances 105. For example, movement toward the rack 103 may cause the cartridge 107 to arrive into a seated position, e.g., such as that shown in FIG. 6.

FIG. 6 depicts the cartridge 107 in a seated position. In the seated position, the cartridge 107 may be secured, for example, by a latch 155 which may engage the cross bar 109 or other portion of the rack 103. The latch 155 can include any pawl or other suitable structure that may be movable to engage in a locking manner to secure the cartridge 107 relative to the rack 103. The latch 155 may be operated by a lever 157, such as by depressing the lever 157 as illustrated by arrow 159. Although a lever 157 is shown in FIG. 6, the latch 155 may be actuated into a locking position by operation of any suitable button or other manipulandum. The cartridge 107 may be secured to the cross bar 109 or other portion of the rack 103 independently of engagement of the connectors 135 of the cartridge 107 with the ports 133 of the appliances 105. For example, the cartridge 107 may be installed and secured in a rack 103 regardless of whether appliances 105 are present in the rack 103. The cartridge 107 being secured by the latch 155 may facilitate other operations relative to the system 101, which may include operations described with respect to FIG. 7, for example.

FIG. 7 depicts another state of the system 101. In FIG. 7, the cartridge 107 is locked, latched, or otherwise secured via the latch 155. The latch 155 can prevent the cartridge from release from the cross bar 109 or other portion of the rack 103. Such securing may be useful, e.g., with respect to movement of appliances 105 such as depicted by arrow 163. For example, the cartridge 107 being secured by the latch 155 may allow appliances 105 to be moved within the rack 103 without impacting the positioning of the cartridge 107 relative to other appliances 105. Additionally or alternatively, the cartridge 107 being secured by the latch 155 may facilitate installation of appliances 105 relative to the rack 103. For example, the sliding motion depicted by arrow 163 (in which the appliance 105 may be pushed against the cartridge 107 to cause engagement between the connector 135 and the port 133) may occur without the cartridge 107 becoming dislodged from pushing by the appliance 105. Securing may facilitate the cartridge 107 maintaining connection among seated appliances 105 even while other appliances 105 are switched to an unseated position and/or installed in open slots within the rack 103. This may prevent disruption of service in the rack 103 in the midst of maintenance in a manner that may be more beneficial than if the cartridge 107 were susceptible to dislodging any time a new appliance 105 were installed or if the cartridge 107 had to be removed to permit access to the appliances 105.

The cartridge 107 may be removed by operations that correspond to progressing in reverse through FIGS. 6 and 5. For example, the latch 155 may be released, such as by toggling the lever 157 opposite the direction indicated by arrow 159 in FIG. 6. Releasing the latch 155 may unlock the cartridge 107 to facilitate removal (e.g., by translation away from the rack 103 in a direction opposite that illustrated by arrow 151 in FIG. 5). The cartridge 107 may be removed, for example, to facilitate maintenance or replacement (e.g., with a cartridge 107 having the same or a different arrangement of cabling 143, depending on the arrangement of interconnection among appliances 105 that is desired for a given scenario).

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system comprising:
    a plurality of appliances each comprising a computer server or a network hardware component;
    a rack in which the appliances are slidingly received and arranged vertically such that ports of the appliances are vertically aligned;
    an upper cross bar rearwardly mounted to an upper portion of the rack above the appliances;
    a lower cross bar rearwardly mounted to a lower portion of the rack below the appliances; and
    a cartridge comprising:
        opposite ends releasably secured respectively to the upper cross bar and the lower cross bar;
        a plurality of forward-extending projections bearing connectors engaged with the vertically aligned ports of the appliances; and
        internal cabling comprising a set of cables connecting differing combinations of the forward-extending projections so as to establish signal paths between respective pairs of the vertically aligned ports of the appliances.

2. The system of claim 1, wherein the cartridge further comprises a latch operable for securing the cartridge to the rack independently of engagement of the connectors of the cartridge with the vertically aligned ports of the appliances.

3. The system of claim 1, wherein the cartridge further comprises a guide pin arranged to engage an opening in the rack and align the cartridge for engagement of the connectors of the cartridge with the vertically aligned ports of the appliances.

4. The system of claim 1, wherein the cartridge is a first cartridge, wherein the system comprises a second cartridge having a different arrangement of cabling therein, wherein the second cartridge is interchangeable with the first cartridge to alter an arrangement of signal paths among the vertically aligned ports of the appliances.

5. A system, comprising:
    a rack;

a plurality of appliances vertically arranged in the rack such that vertically aligned ports of the appliances are present; and a cartridge comprising an upright rigid body along which connectors are arranged, the connectors engageable with the vertically aligned ports of the appliances in response to translation of the cartridge toward the rack, wherein the cartridge further comprises cabling within the upright rigid body, the cabling providing paths among subsets of the connectors.

6. The system of claim 5, wherein the rack further comprises at least one cross bar arranged for receiving a portion of the cartridge.

7. The system of claim 5, wherein the rack includes a receptacle sized and arranged to receive a guide of the cartridge so as to align the connectors with the vertically aligned ports.

8. The system of claim 5, wherein the cartridge is securable to the rack by a latch.

9. The system of claim 8, wherein the latch secures the cartridge to the rack in a position in which the cartridge maintains connection among seated appliances in the rack as other appliances are slidingly removed from engagement with the cartridge.

10. The system of claim 8, wherein the latch secures the cartridge to the rack in a position in which the cartridge maintains connection among seated appliances in the rack as other appliances are slidingly moved into engagement with the cartridge.

11. The system of claim 5, wherein the cartridge is a first cartridge, and wherein the system further comprises a second cartridge positionable laterally from the first cartridge in engagement with another set of vertically aligned ports of the appliances.

12. The system of claim 5, wherein the cartridge is installed at a rear of the rack.

13. The system of claim 5, wherein the plurality of appliances each comprises a computer server or a network hardware component;
   wherein the appliances are slidingly received and arranged vertically above or below one another in the rack;
   wherein the system further comprises an upper cross bar rearwardly mounted to an upper portion of the rack above the appliances;
   wherein the system further comprises a lower cross bar rearwardly mounted to a lower portion of the rack below the appliances;
   wherein the cartridge further comprises opposite ends releasably secured respectively to the upper cross bar and the lower cross bar;
   wherein the cartridge further comprises a plurality of forward-extending projections bearing the connectors;
   wherein the connectors are engaged with the vertically aligned ports of the appliances;
   wherein the cabling comprises internal cabling comprising a set of cables connecting differing combinations of the forward-extending projections so as to establish signal paths between respective pairs of the vertically aligned ports of the appliances;
   wherein the connectors are sized for engagement with the vertically aligned ports of the appliances; and
   wherein the cabling is routed to couple subsets of the connectors to one another.

14. A system comprising a cartridge for installation relative to a rack or relative to a plurality of appliances arranged in the rack such that ports of the appliances are linearly aligned along a first direction, the cartridge comprising:
   an elongate rigid body;
   connectors arranged along the elongate rigid body and sized for engagement with the aligned ports of the appliances, wherein the connectors are engageable with the linearly aligned ports of the appliances in response to translation of the cartridge toward the rack; and
   cabling arranged within the elongate rigid body and routed to couple subsets of the connectors to one another, the cabling providing paths among subsets of the connectors.

15. The system of claim 14, wherein the cartridge comprises a guide engageable with the rack so as to align the connectors with the linearly aligned ports.

16. The system of claim 14, wherein the cartridge comprises a manipulandum actuatable to engage or disengage a latch operable to secure the cartridge to the rack.

17. The system of claim 14, wherein the cabling comprises optical cables or electrical cables.

18. The system of claim 14, further comprising the rack and the plurality of appliances linearly arranged in the rack.

19. The system of claim 14, wherein the plurality of appliances each comprises a computer server or a network hardware component;
   wherein the appliances are slidingly received and arranged vertically in the rack such that the ports of the appliances are vertically aligned;
   wherein the system further comprises an upper cross bar rearwardly mounted to an upper portion of the rack above the appliances;
   wherein the system further comprises a lower cross bar rearwardly mounted to a lower portion of the rack below the appliances;
   wherein the cartridge further comprises opposite ends releasably secured respectively to the upper cross bar and the lower cross bar;
   wherein the cartridge further comprises a plurality of forward-extending projections bearing the connectors;
   wherein the connectors are engaged with the vertically aligned ports of the appliances; and
   wherein the cabling comprises internal cabling comprising a set of cables connecting differing combinations of the forward-extending projections so as to establish signal paths between respective pairs of the vertically aligned ports of the appliances.

* * * * *